(12) United States Patent
DeHaven et al.

(10) Patent No.: US 6,333,120 B1
(45) Date of Patent: *Dec. 25, 2001

(54) METHOD FOR CONTROLLING THE TEXTURE AND MICROSTRUCTURE OF PLATED COPPER AND PLATED STRUCTURE

(75) Inventors: Patrick William DeHaven, Poughkeepsie; Peter S. Locke, Hopewell Junction, both of NY (US); Kenneth P Rodbell, Sandy Hook, CT (US); Cyprian Emeka Uzoh, Milpitas, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/427,703

(22) Filed: Oct. 27, 1999

(51) Int. Cl.[7] .............................. B32B 15/00; H01L 29/12; C25D 11/32; C25D 5/10; C25D 5/48
(52) U.S. Cl. ..................... 428/615; 428/620; 428/469; 205/157; 205/182; 205/220
(58) Field of Search ..................... 205/157, 159, 205/162, 163, 164, 182, 186, 184, 187, 915, 220, 171; 428/615, 620, 607, 612, 687, 469

(56) References Cited

U.S. PATENT DOCUMENTS

| | | | |
|---|---|---|---|
| 5,366,814 | * 11/1994 | Yamanishi et al. | 428/607 |
| 6,114,097 | * 9/2000 | Malba et al. | 430/314 |
| 6,123,825 | * 9/2000 | Uzoh et al. | 205/183 |
| 6,180,505 | * 1/2001 | Uzoh | 438/614 |

OTHER PUBLICATIONS

Ritzdorf et al, Self–Annealing of Electrochemically Deposited Copper Films in Advanced Interconnect Applications, IITC 98, 1998, pp. 166–168. No Month Available.

Harper et al, Mechanisms for Microstructure Evolution in Electroplated Copper Thin Films near Room Temperature, Journal of Applied Physics, vol. 86, No. 5, Sep. 1, 1999, pp. 2516–2525.

Cabral, Jr. et al, Room Temperature Evolution of Microstructure and Resistivity in Electroplated Copper Films, Conference Proceedings ULSI XIV, 1999, pp. 81–87. No Month Available.

* cited by examiner

*Primary Examiner*—Edna Wong
(74) *Attorney, Agent, or Firm*—Connolly Bove Lodge & Hutz; Robert M. Trepp

(57) ABSTRACT

Copper is plated onto a substrate by plating a layer of copper onto the substrate to provide a maximum thickness of about 350 nanometers, followed by subjecting the copper coated substrate to an oxygen containing gaseous ambient in order to roughen the copper surface. Next, a second layer of copper is electroplated onto the structure to provide the desired thickness. The texture of the second layer of copper is independent of the underlayer of copper and has a random or at least substantially random texture.

16 Claims, 3 Drawing Sheets

METHOD FOR CONTROLLING THE TEXTURE AND MICROSTRUCTURE OF PLATED COPPER AND PLATED STRUCTURE

DESCRIPTION

1. Technical Field

The present invention relates to a method for electroplating copper onto a substrate, and more particularly, to a method that results in a copper layer having a substantially random texture. The texture and microstructure of the copper layer is not dependent upon the underlayer metal. The present invention also relates to the coated structure obtained by the process of the present invention.

2. Background of Invention

On VLSI and ULSI semiconductor chips, Al, alloys of AlCu and related alloys are used for conventional chip wiring materials. More recently Cu and alloys of Cu have been suggested as chip wiring material. The use of Cu and Cu alloys results in improved chip performance and superior reliability when compared to Al and alloys of Al.

Performance is improved because the resistivity of Cu and certain copper alloys is less than the resistivity of AlCu; thus narrower lines can be used and higher wiring densities will be realized.

The advantages of Cu metallization have been recognized by the entire semi-conductor industry. Copper metallization has been the subject of extensive research as documented by two entire issues of the Materials Research Society (MRS) Bulletin, one dedicated to academic research on this subject in MRS Bulletin, Volume XVIII, No. 6 (June 1993) and the other dedicated to industrial research in MRS Bulletin, Volume XIX, No. 8 (August 1994). A 1993 paper by Luther et al., *Planar Copper-Polyimide Back End of the Line Interconnections for ULSI Devices*, in PROC. IEEE VLSI MULTILEVEL INTERCONNECTIONS CONF., Santa Clara, Calif., Jun. 8–9, 1993, p. 15, describes the fabrication of Cu chip interconnections with four levels of metallization.

Processes such as Chemical Vapor Deposition (CVD) and electroless plating are popular methods for depositing Cu. Both methods of deposition normally produce at best conformal deposits and inevitably lead to defects (voids or seams) in wiring especially when trenches have a cross section wider at the top than at the bottom as a result of lithographic or reactive ion etching (RIE) imperfections. Other problems of CVD have been described by Li et al., *Copper-Based Metallization in ULSI Structures—Part II: Is Cu Ahead of its Time as an On-chip Material?*, MRS BULL., XIX, 15 (1994). In electroless plating, while offering the advantage of low cost, the evolution of hydrogen during metal deposition leads to blistering and other defects that are viewed as weaknesses for industry wide implementation.

More recently, improved methods for electroplating copper have been provided such as that disclosed in U.S. application Ser. No. 08/768,107 to Andricacos et al, entitled "Electroplated Interconnection Structures on Integrated Circuit Chips", filed Dec. 16, 1990, now abandoned, and assigned to International Business Machines Corporation, the assignee of the present application, disclosure of which is incorporated herein by reference. The process disclosed therein provide a method for fabricating a low cost, highly reliable Cu interconnect structure for wiring in integrated circuit chips with void-free seamless conductors of submicron dimensions.

When plating, the texture and microstructure of the plated metal is essentially controlled by the nature of the seed layer below. As a consequence of this phenomenon, the microstructure and texture of a plated film is often identical or close to that of the underlying substrate. For example, the texture of electroplated copper thin films for interconnect applications tends to be highly oriented with a <111> texture. This high <111> texture in the plated film being inherited from the highly oriented sputtered seedlayer beneath the plated film.

However, for copper interconnection technology, the present inventors have discovered that copper films with random orientation possess high electromigration lifetimes. In general, it has been found according to the present invention that copper films with random or near random texture to be superior to highly oriented copper films deposited by either PVD or CVD methods. Since the plated Cu film grows somewhat epitaxially on the seed layer, the plated Cu film tends to be also <111> textured. The plated Cu texture is difficult to modify or to control once it has developed and it is difficult to decouple the texture of the plated Cu film from that of the original Cu seed layer.

However, in practice, it is difficult to realize random texture in electroplated copper films, for the reasons given above. As a consequence, there exists the need for methods that can decouple the texture of electrodeposited metal from the texture of the seed layer or substrate underlying the plated film.

SUMMARY OF INVENTION

The present invention provides a process and structure that decouples the texture of a deposited metal from the texture of the substrate below the deposited film. The structure and process for electrodepositing copper according to the present invention is such that the texture of the plated film is independent of the texture of the seed layer or nature of the substrate below. The process of the present invention provides electroplated copper films exhibiting random or near random texture, as opposed to the nominal and routine highly oriented films.

In particular, the plating method of the present invention comprises plating a layer of copper onto a substrate up to a maximum thickness of about 350 nanometers, followed by subjecting the copper coated substrate to an oxygen-containing gaseous ambient for a time sufficient to roughen the surface of the plated copper. Copper is then electroplated onto the roughened copper surface to provide the desired copper thickness.

The present invention also relates to a copper plated substrate obtained by the above disclosed process.

A still further aspect of the present invention relates to a copper plated substrate which comprises a substrate comprising a first copper underlayer having a maximum thickness of up to 350 nanometers, and a second layer of copper on the copper underlayer wherein the second layer of copper has a thickness of at least about 200 nanometers and a substantially random texture. For purposes of definition, substantially random texture in copper is determined by a diffraction scan of the copper using a conventional (Bragg-Brentano optics) x-ray powder diffractometer. From the diffraction scan, the peak intensities of the Cu<111> and Cu<200> reflections are obtained. If the ratio of the Cu<200> to Cu<1111> peak intensity is greater than 15/100, then the copper is considered to have substantially random texture.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
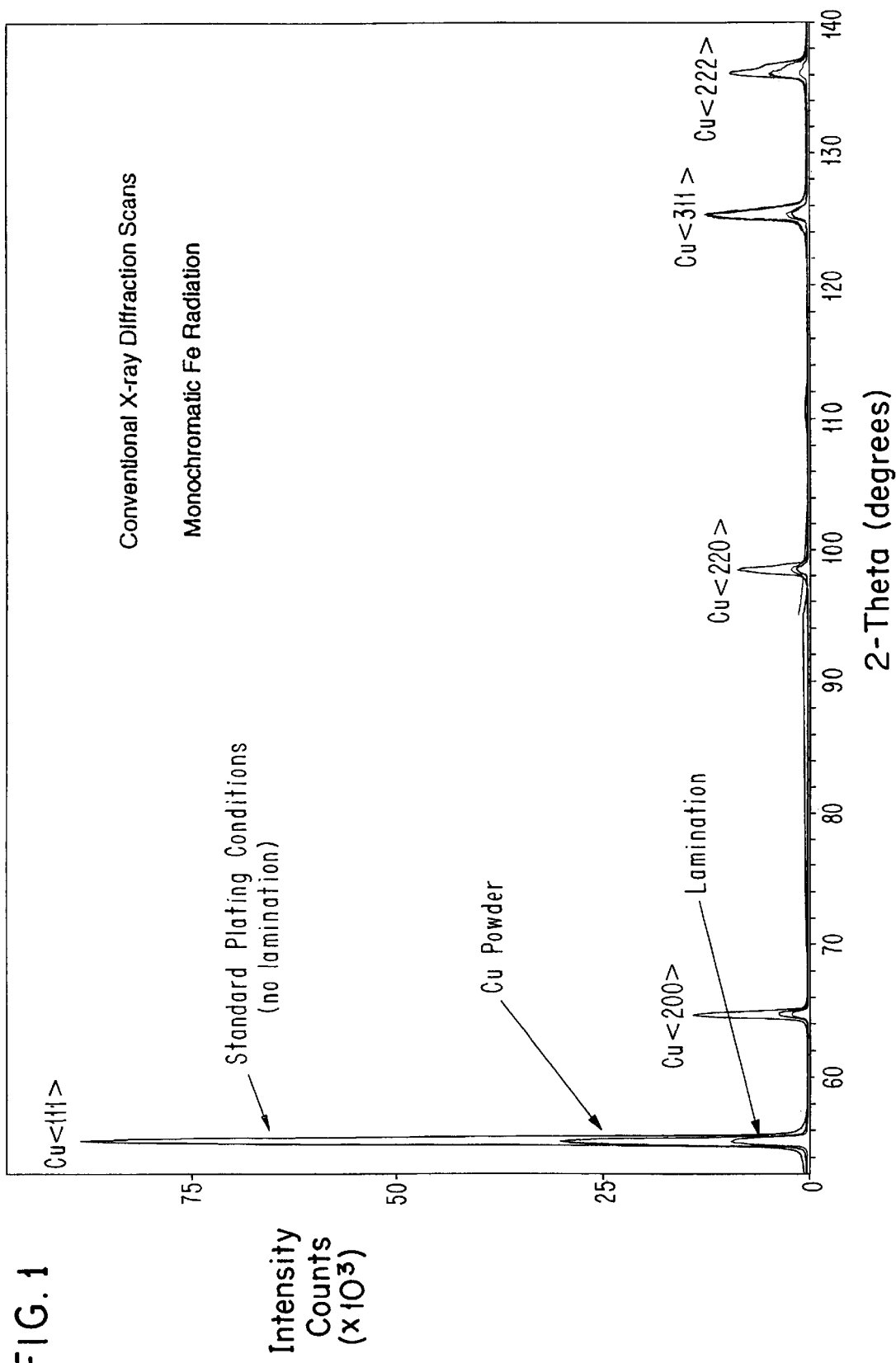
FIG. 1 shows diffraction scans for different copper films.

In order to facilitate an understanding of the present invention, the ensuing discussion will be directed to a damascene plating process, a preferred type of structure especially benefited by the present invention.

In particular, a passivation layer such as $SiO_2$, is deposited over the surface of a semiconductor substrate such as silicon, silicon carbide and Group III–V semiconductor substrates such as gallium arsenide. A typical substrate is a <100> silicon wafer. Also, the substrate typically comprises a plurality of active devices formed by conventional methods. Trenches or vias which correspond to an interconnection line pattern are defined in a single or multi-layer photoresist structure on top of the passivation layer. The trenches or vias can be formed by reactive ion etching (RIE) of the passivation layer to a depth dictated by the desired interconnection line thickness.

Typically, the next step is to provide in the trench (or trenches) a diffusion barrier made of tungsten or any other similar refractory metal, such as molybdenum, tantalum, titanium, chromium, chromium/chromium oxide, or nitrides thereof or any combination thereof. This can be accomplished by first depositing the metal by chemical vapor deposition (CVD) or physical vapor deposition techniques.

The barrier layer is typically about 20 to about 200 nanometers thick.

A seed layer of copper is then deposited such as by chemical vapor deposition (CVD) or physical vapor deposition (PVD) to provide a continuous electrically conductive layer.

The copper seed is typically about 10 to about 250 nanometers thick.

Following the deposition of the seed layer, a relatively thin layer of copper can be deposited by electroplating. This layer is typically about 20 to about 300 nanometers thick and more typically about 30 to about 150 nanometers thick. However, the step can be omitted when the copper seed layer is at least about 75 nanometers thick. Nevertheless, even in cases when the copper seed layer is at least about 75 nanometers thick, it is preferred to proceed with this step of electroplating copper. In any event, combined thickness of the copper seed layer and electroplated thin copper layer, if present, is typically at least about 75 nanometers thick.

Any suitable copper electroplating composition can be employed. Copper electrolytic plating baths typically contain a source of cupric ions such as copper sulfate and an inorganic acid such as sulfuric acid. Preferably, the electroplating copper baths employed in the process of the present invention are formulated with a high A/B ratio (A=brightener, B-leveller or suppression) as high as about 20/1. This high concentration of additives in the bath leads to an increased dopant concentration in the plated Cu film.

Preferred plating compositions are disclosed in U.S. patent application Ser. No. 08/768,107 filed Dec. 16, 1996, now abandoned. The composition of various additives such as the combination marketed by Enthone-OMI, Inc., of New Haven, Conn., known as the SelRex Cubath M system. The above additives are referred to by the manufacturer as MHy. Another suitable system of additives is the one marketed by LeaRonal, Inc., of Freeport, N.Y., and is known as the Copper Gleam 2001 system. The additives are referred to by the manufacturer as Copper Gleam 2001 Carrier, Copper Gleam 2001-HTL, and Copper Gleam 2001 Leveller. And another suitable system of additives is the one marketed by Atotech USA, Inc., of State Park, Pa., and is known as the Cupracid HS system. The additives in this system are referred to by the manufacturer as Cupracid Brightener and Cupracid HS Basic Leveller.

Examples of specific additives which may be added to a bath in the instant invention are described in several patents. U.S. Pat. No. 4,110,176 to Creutz deceased et al., entitled "Electrodeposition of Copper" described the use of additives to a plating bath such as poly alkanol quaternary-ammonium salt which formed as a reaction product to give bright, highly ductile, low stress and good leveling copper deposits from an aqueous acidic copper plating bath which patent is incorporated herein by reference.

U.S. Pat. No. 4,376,685 to Watson, entitled "Acid Copper Electroplating Baths Containing Brightening and Leveling Additives," described additives to a plating bath such as alkylated polyalkyleneimine which formed as a reaction product to provide bright and leveled copper electrodeposits from an aqueous acidic bath which patent is incorporated herein by reference.

U.S. Pat. No. 4,975,159 to Dahms, entitled "Aqueous Acidic Bath for Electrochemical Deposition of a Shiny and Tear-free Copper Coating and Method of Using Same," described adding to an aqueous acidic bath combinations of organic additives including at least one substituted alkoxylated lactam as an amide-group-containing compound in an amount to optimize the brightness and ductility of the deposited copper, which patent is incorporated herein by reference. In U.S. Pat. No. 4,975,159, Table I lists a number of alkoxylated lactams which may be added to a bath in the instant invention. Table II lists a number of sulfur-containing compounds with water-solubilizing groups such as 3-mercaptopropane-1-sulfonic acid which may be added to a bath in the instant invention. Table III lists organic compounds such as polyethylene glycol which may be added to a bath as surfactants in the instant invention.

U.S. Pat. No. 3,770,598 to Creutz, entitled "Electrodeposition of Copper from Acid Baths," describes baths for obtaining ductile, lustrous copper containing therein dissolved a brightening amount of the reaction product of polyethylene imine and an alkylating agent to produce a quaternary nitrogen, organic sulfides carrying at least. one sulfonic group, and a polyether compound such as polypropylene glycol, which patent is incorporated herein by reference.

U.S. Pat. No. 3,328,273 to Creutz et al., entitled "Electrodeposition of Copper from Acidic Baths," describes copper sulfate and fluoborate baths for obtaining bright, low-stress deposits with good leveling properties that contain organic sulfide compounds of the formula $XR_1$—$(S_n)$—$R_2$—$SO_3H$, where $R_1$ and $R_2$ are the same or different and are polymethylene groups or alkyne groups containing 1–6 carbon atoms, X is hydrogen or a sulfonic group, and n is an integer of 2–5 inclusive, which patent is incorporated herein by reference. Additionally these baths may contain polyether compounds, organic sulfides with vicinal sulphur atoms, and phenazine dyes. In U.S. Pat. No. 3,328,273, Table I lists a number of polysulfide compounds which may be added to a bath in the instant invention. Table II lists a number of polyethers which may be added to a bath in the instant invention.

Additives may be added to the bath for accomplishing various objectives. The bath may include a copper salt and a mineral acid. Additives may be added to the bath for incorporating in the conductor material molecular fragments containing atoms selected from the group consisting of C, O, N, S and Cl whereby the electromigration resistance is enhanced over pure Cu.

Typical plating solutions contain cupric sulfate in the range from about 0.1 to about 0.4M, sulfuric acid in the range from about 10 to about 20% by volume, chloride in the range from about 10 to about 300 ppm, and LeaRonal additives Copper Gleam 2001 Carrier in the range from about 0.1 to about 1% by volume, Copper Gleam 2001-HTL in the range from about 0.1 to about 1% by volume, and Copper Gleam 2001 Leveller in the range about 0 to about 1% by volume. Other solutions contain cupric sulfate, sulfuric acid, and chloride in the ranges mentioned above and Atotech additives Cupracid Brightener in the range from about 0.5 to about 3% by volume and Cupracid HS Basic Leveller in the range from about 0.01 to about 0.5by volume.

The plating is preferably carried out employing a cup plating or paddle cell plating technique such as using the paddle plating cells described in U.S. Pat. Nos. 5,516,412 and 5,312,532 to Andricacos et al, disclosures of which are incorporated herein by reference.

Next, the structure with the relatively thin copper layers is removed from the electroplating bath and subjected to an oxygen-containing gaseous ambient such as air in order to decouple the microstructure of the underlying copper seed layer from the subsequently to be applied copper film. The exposure to the oxygen-containing gaseous ambient is for a time sufficient to roughen the upper surface. Usually, this takes about 10 to about 120 seconds, and more typically about 15 to about 45 seconds. Preferably, the exposure to the oxygen-containing ambient is carried out employing a spin drying technique such as using the spin apparatus suitable for the electroplating. This step forms a surface oxide layer on the copper.

Next, a copper film is then electroplated to the desired thickness which is typically about 500 to about 2000 nanometers. The plating bath employed can be any of the electroplating baths discussed above.

In view of the oxygen exposure, the structure of this copper layer is decoupled from that of the initial underlayer copper seed layer permitting the formation of the desired random orientation. Oxygen incorporation into the film is negligible since oxygen dissolves into the plating bath immediately upon immersion during this electroplating step.

The following non-limiting example is presented to further illustrate the present invention.

EXAMPLE 1

Three samples were examined. Two of the samples were blanket copper films: one plated under "standard" conditions, while the other plated using the sequential deposition procedure (termed "lamination") of the present invention. Prior to the diffraction scans, both samples were allowed to remain at room temperature for a period of time sufficient to ensure the completion of the room temperature grain growth documented by several investigators (ref. 1, ref. 2). The third sample was a copper powder (SPEX 5 9's Cu) which was assumed to have a "random" orientation of the copper grains. Conventional diffraction scans were run on a Siemens D500 diffractometer using monochromatic iron radiation from a sealed tube source operating at 35 kV and 35 mA. Slits used were I–III=1°, IV=0.6 mm. For the plated films, the scans ranged from 53 to 70° and 95 to 140° $7\theta$, which covers the Cu <111> through Cu <222> reflections. A scan range of 50 to 140° θ was used for the copper powder. The counting time for all scans was 3 sec/step, and the stepsize was 0.05°. The degree of preferred orientation was determined from peak height intensities taken from the diffraction pattern. The intensities were normalized to that of the strongest copper peak in the pattern, which was arbitrarily assigned a value of 100.

A comparison of the diffraction scans is shown in FIG. 1, with the relative peak intensities summarized in Table 1. Also included in the table are the relative peak intensities for a "randomly oriented" reference copper taken from the JCPDS power diffraction file.

TABLE 1

Relative Peak Intensities of Cu Samples

| Sample | Cu<111> | Cu<200> | Cu<220> | Cu<311> | Cu<222> |
|---|---|---|---|---|---|
| Plated Cu Control | 100 | 4 | 2 | 3 | 17 |
| Present invention Cu | 100 | 21 | 18 | 38 | 15 |
| Cu Powder | 100 | 48 | 32 | 57 | 25 |
| "Random" Cu (reference) | 100 | 46 | 20 | 17 | 5 |

Figure 2:
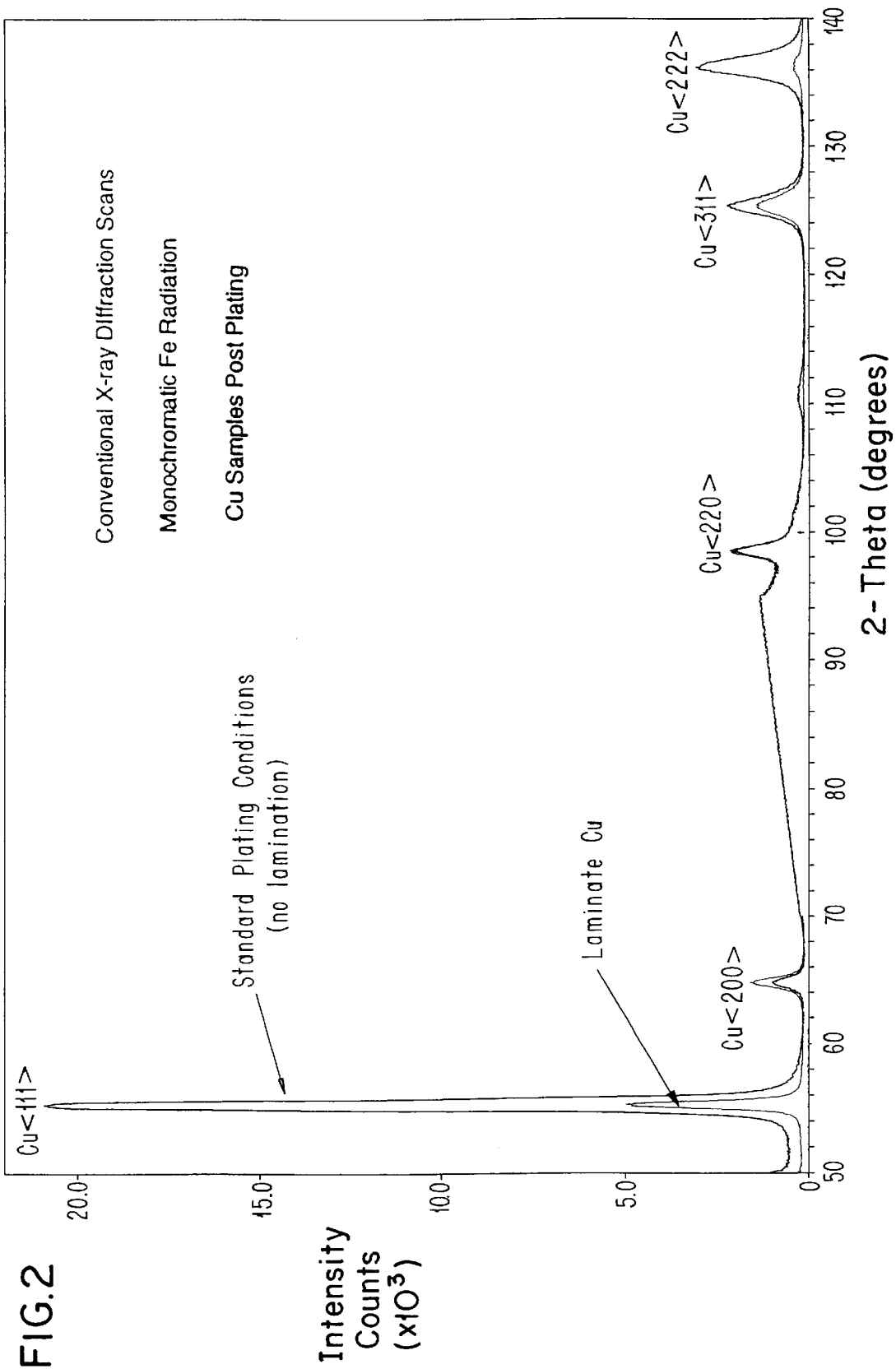
FIG. 2 shows diffraction scans of different plated copper films immediately after plating.

A second set of two samples were examined. Both samples were blanket copper films: one plated under "standard" conditions, with the other plated using the sequential deposition procedure (termed "lamination") of the present invention. The diffraction scans were carried out immediately after the films were plated, before the room temperature grain growth could occur. Comparison of the as plated films are shown in FIG. 2. The normalized peak intensities are summarized in Table 2 below.

TABLE 2

| Sample | Cu<111> | Cu<200> | Cu<220> | Cu<311> | Cu<222> |
|---|---|---|---|---|---|
| Control | 100 | 4 | 7 | 7 | 9 |
| Present invention | 100 | 28 | 26 | 18 | 3 |
| "Randomly Oriented" Cu Powder | 100 | 46 | 20 | 17 | 5 |

In both sets of samples, the film plated according to the present invention shows a substantially random texture, whereas the controls show a higher degree of Cu<111> preferred orientation.

Figure 3:
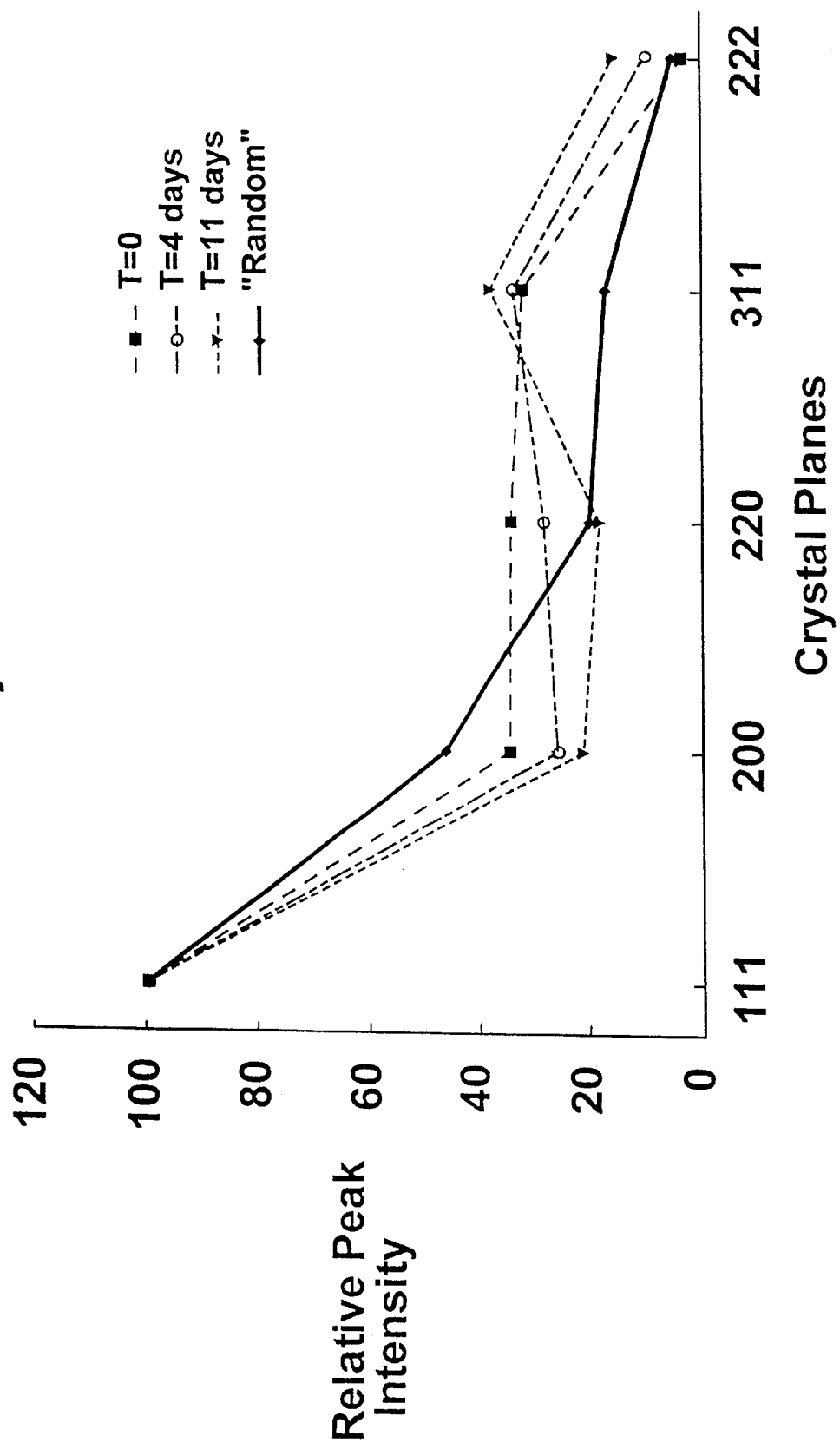
FIG. 3 shows relative peak intensities of different plated Cu films as a function of time after plating.

The change in relative peak intensities as a function of time after plating was also examined. The intensity values reported are from peak areas and are normalized to the intensity of the strongest peak (Cu<111>) which is arbitrarily assigned a value of 100. FIG. 3 illustrates the results achieved according to the present invention and shows that the film plated according to the present invention maintains a substantially random texture during the room temperature grain growth process.

Ref. 1: T. Ritzdorf, et al., Proc. IEEE Int. Interconnect Tech. Conf., p. 166 (1998)

Ref. 2: C. Cabral, et al., Proc. Adv. Metall. Conf. (1998) in press.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for plating copper onto a substrate which comprises plating a copper underlayer which comprises a layer of electroplated copper onto a substrate up to a maximum thickness of about 350 nanometers;

subjecting the copper coated substrate to an oxygen-containing gaseous ambient for a time sufficient to roughen the surface of the copper; and then electroplating a second layer of copper to provide a thickness of at least about 200 nanometers.

2. The method of claim 1 wherein the substrate is a silicon substrate.

3. The method of claim 1 wherein the copper underlayer is a seed layer having a thickness of at least about 75 nanometers.

4. The method of claim 1 wherein the copper underlayer comprises a seed layer of copper and said layer of electroplated copper on top of the seed layer.

5. The method of claim 4 wherein the seed layer of copper has a thickness of about 10 to about 150 nanometers.

6. The method of claim 4 wherein the seed layer of copper is deposited by physical vapor deposition or chemical vapor deposition.

7. The method of claim 4 wherein the second layer of electroplated copper is about 200 to about 2000 nanometers thick.

8. The method of claim 4 which comprises carrying out the electroplating by spin plating.

9. The method of claim 1 wherein the copper coated substrate is subjected to said oxygen containing gaseous ambient for about 15 to about 45 seconds.

10. The method of claim 1 wherein the copper coated substrate is subjected to said oxygen containing gaseous ambient by spin drying in air.

11. The method of claim 1 wherein the substrate comprises a passivation layer and vias located in the passivation layer and wherein the copper is plated into the vias.

12. The method of claim 11 which further comprises depositing a barrier layer in the vias prior to the copper underlayer.

13. The method of claim 12 wherein the barrier layer comprises at least one refractory metal or nitride thereof.

14. The method of claim 12 wherein the barrier layer comprises tungsten.

15. The method of claim 12 wherein the barrier layer is about 20 to about 200 nanometers thick.

16. A copper plated substrate obtained by the process of claim 1.

* * * * *